United States Patent
Roy et al.

(10) Patent No.: US 8,193,479 B2
(45) Date of Patent: Jun. 5, 2012

(54) VERY SMALL IMAGE SENSOR

(75) Inventors: François Roy, Seyssins (FR); Benoît Ramadout, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 396 days.

(21) Appl. No.: 12/429,413

(22) Filed: Apr. 24, 2009

(65) Prior Publication Data
US 2009/0266973 A1    Oct. 29, 2009

(30) Foreign Application Priority Data
Apr. 24, 2008    (FR) .................................... 08 52759

(51) Int. Cl.
*H01L 27/00*    (2006.01)
*H01L 31/101*   (2006.01)

(52) U.S. Cl. ................. 250/208.1; 250/214.1; 257/445; 257/446; 438/42; 438/424

(58) Field of Classification Search ............... 250/208.1, 250/214.1; 257/291, 292, 230, 445, 446; 438/42, 44, 79, 424
See application file for complete search history.

(56) References Cited

U.S. PATENT DOCUMENTS

| 6,177,333 | B1 * | 1/2001 | Rhodes ..................... 438/433 |
| 2003/0089929 | A1 * | 5/2003 | Rhodes ..................... 257/219 |
| 2003/0168701 | A1 * | 9/2003 | Voldman ................... 257/355 |
| 2005/0184291 | A1 | 8/2005 | Cole et al. |
| 2005/0184353 | A1 | 8/2005 | Mouli |
| 2006/0043437 | A1 | 3/2006 | Mouli |
| 2006/0081887 | A1 | 4/2006 | Lyu |
| 2007/0158713 | A1 | 7/2007 | Ohkawa |
| 2007/0272958 | A1 | 11/2007 | Misaki et al. |

OTHER PUBLICATIONS

French Search Report dated Jan. 9, 2009 from corresponding French Application No. 08/52759, filed Apr. 24, 2008.

* cited by examiner

*Primary Examiner* — Kevin Pyo
(74) *Attorney, Agent, or Firm* — Wolf, Greenfield & Sacks, P.C.

(57) ABSTRACT

An image sensor formed in a semiconductor stack of a lower region of a first conductivity type and of an upper region of a second conductivity type, including: a photodiode formed of a first portion of the stack; a read area formed of a second portion of the stack; a trench with insulated walls filled with a conductive material, the trench surrounding the photodiode and the read area and being interrupted, all along its height, on a portion facing the photodiode and the read area; and first connection mechanism associated with the conductive material of the trench and capable of being connected to a reference bias voltage.

10 Claims, 4 Drawing Sheets

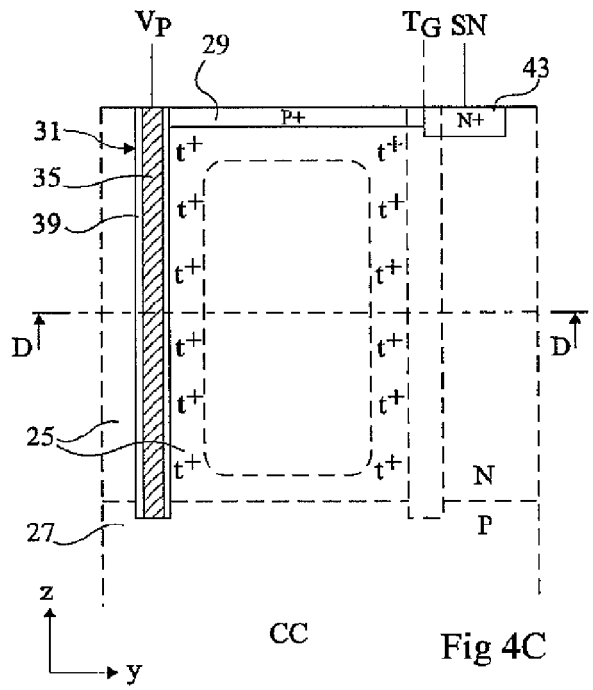
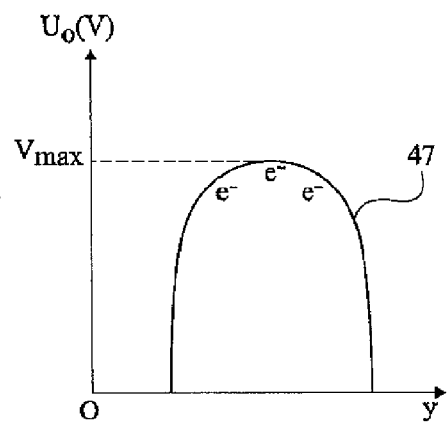
Fig 4C
Fig 4D
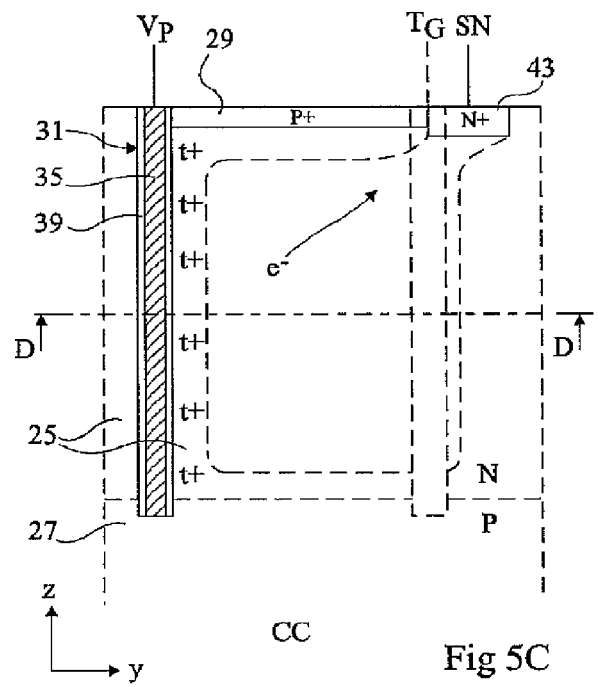
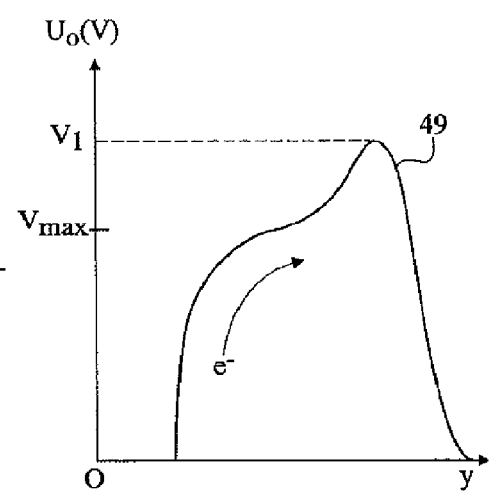
Fig 5C
Fig 5D

VERY SMALL IMAGE SENSOR

CROSS REFERENCE TO RELATED APPLICATIONS

This application claims the priority benefit of French patent application Ser. No. 08/52759, filed on Apr. 24, 2008, entitled "VERY SMALL IMAGE SENSOR," which is hereby incorporated by reference to the maximum extent allowable by law.

BACKGROUND OF THE INVENTION

1. Field of the Invention

The present invention relates to an image sensor made in monolithic form for use in image shooting devices.

More specifically, the present invention relates to an image sensor formed of small elements.

2. Discussion of the Related Art

Conventionally, a monolithic image sensor comprises photodiodes and transistors formed in a silicon substrate. More specifically, each pixel of an image sensor comprises a photodiode associated with a transfer transistor having its drain region associated with a read and processing circuit comprising one or several transistors. An insulation trench extending from the substrate surface enables insulating the photodiodes from one another.

A concern of those skilled in the art is to decrease the size of image sensor pixels. For this purpose, it has been provided to decrease the electron detection and collection surface areas of the photodiodes. This requires increasing the thickness of the collection areas to be able to accumulate enough charges. This however raises several problems.

First, the size decrease of collection areas increases the risk of interferences, also called crosstalk, between the different photodiodes. Indeed, if the photodiodes are very close to one another, electrons intended to reach a given photodiode can be more easily attracted by a neighboring photodiode.

U.S. Pat. No. 7,239,003 provides, to limit the crosstalk, forming deeper insulation trenches. It can however be seen, especially in FIG. 6 of this patent, that the pixel dimensions are not optimized since a space 323 is necessary between the electron collection area of photodiode 326 and insulation trenches 328.

Further, when electrons are stored at the bottom of a thick area, they are difficult to transfer by means of a conventional transfer transistor formed at the substrate surface. Thereby, many electrons remain in the collection area after transfer. These electrons create remanence currents which appear on subsequent read operations and which disturb the photodiode detection.

There thus is a need for an image sensor comprising pixels of small dimensions and high storage capacities, with an insulation enabling limiting crosstalk phenomena and enabling full transfer of the electrons stored in a photodiode.

SUMMARY OF THE INVENTION

An object of an embodiment of the present invention is to provide a photodiode associated with a charge transfer system of an image sensor of small size.

Another object of an embodiment of the present invention is to provide a photodiode associated with a charge transfer system of a low-crosstalk image sensor.

Another object of an embodiment of the present invention is to provide a photodiode associated with a charge transfer system of an image sensor with a low dark current.

Another object of an embodiment of the present invention is to provide a photodiode associated with a charge transfer system of an image sensor with a high storage capacity.

Thus, an embodiment of the present invention provides an image sensor formed in a semiconductor stack of a lower region of a first conductivity type and of an upper region of a second conductivity type, comprising: a photodiode formed of a first portion of said stack; a read area formed of a second portion of said stack; a trench with insulated walls filled with a conductive material, the trench surrounding the photodiode and the read area and being interrupted, all along its height, on a portion facing the photodiode and the read area; and first connection means associated with the conductive material of the trench and capable of being connected to a reference bias voltage.

According to an embodiment, a column with insulated walls filled with a conductive material is formed in the interruption area of the trench, the conductive material of the column being associated with second connection means capable of being connected to a reference bias voltage or to a transfer voltage.

According to an embodiment, a heavily-doped area of the second conductivity type is formed at the surface of the read area, said area forming the drain of a transistor, with its column forming the gate thereof.

According to an embodiment, a heavily-doped area of the first conductivity type is formed at the surface of the photodiode.

According to an embodiment, the trench and the column have depths ranging between 1 and 10 μm, the conductive material in the trench and in the column is polysilicon, and the material forming the insulated walls of the column and of the trench is selected from the group comprising silicon oxide, silicon nitride, silicon oxynitride, or is formed of a multiple-layer stack of these materials.

According to an embodiment, the first conductivity type is type P and the second conductivity type is type N.

According to an embodiment, at least one second column with insulated walls filled with a conductive material is formed in the interruption area of the trench, the conductive material of the second column being connected to the conductive material of the first column.

According to an embodiment, at least two photodiodes are formed in front of a same read area.

Another embodiment of the present invention provides a method for manufacturing an image sensor comprising the steps of: forming, in a semiconductor substrate of a first conductivity type, a trench and a column, the trench surrounding at least a portion of the substrate and being interrupted, across a portion of its periphery and all along its height, the column being located in the trench interruption region; forming, on the bottom and the walls of the trench and of the column, an insulating layer; filling the space remaining in the trench and in the column with a conductive material; forming, in the semiconductor substrate of the first conductivity type and at the surface thereof, a layer of a second conductivity type; forming, in the enclosure delimited by the trench and the column, at the surface of the layer of the second conductivity type, a heavily-doped area of the first conductivity type; and forming, opposite to the heavily-doped area of the first conductivity type with respect to the column, at the surface of the layer of the second conductivity type, a heavily-doped area of the second conductivity type.

Another embodiment of the present invention provides a method for manufacturing an image sensor comprising the steps of: forming a semiconductor stack of a substrate of a first conductivity type on which a layer of a second conductivity type extends; forming, in the stack, a trench and a column, the trench surrounding at least a portion of the stack and being interrupted, across a portion of its periphery and all along its height, the column being located in the trench interruption area; forming, on the bottom and the walls of the trench and of the column, an insulating layer; filling the space remaining in the trench and in the column with a conductive material; forming, in the enclosure delimited by the trench and the column, at the surface of the layer of the second conductivity type, a heavily-doped area of the first conductivity type; and forming, opposite to the heavily-doped area of the first conductivity type with respect to the column, at the surface of the layer of the second conductivity type, a heavily-doped area of the second conductivity type.

Another embodiment of the present invention provides a method for using an image sensor such as described hereabove, comprising the steps of: connecting the first connection means associated with the conductive material of the trench to a reference bias voltage; connecting the second connection means associated with the conductive material of the column to a reference bias voltage; exposing the image sensor to a light source which is desired to be detected; connecting the second connection means associated with the conductive material of the column to a voltage greater than the maximum electrostatic potential of the electrons captured by the photodiode, and connecting the heavily-doped area of the second conductivity type to an adapted read and processing circuit.

The foregoing objects, features, and advantages of the present invention will be discussed in detail in the following non-limiting description of specific embodiments in connection with the accompanying drawings.

BRIEF DESCRIPTION OF THE DRAWINGS

FIG. 4C is a cross-section view of the device of FIGS. 2 and 3 along cross-section line C-C of FIG. 3, when the gate of the transfer transistor is biased to a reference voltage;

FIG. 4D is a curve of the electrostatic potential along line D-D of FIG. 4C;

FIG. 5C is a cross-section view of the device of FIGS. 2 and 3 along cross-section line C-C of FIG. 3, when the gate of the transfer transistor is biased to create a transfer channel;

FIG. 5D is a curve of the electrostatic potential along line D-D of FIG. 5C.

DETAILED DESCRIPTION

Figure 1:
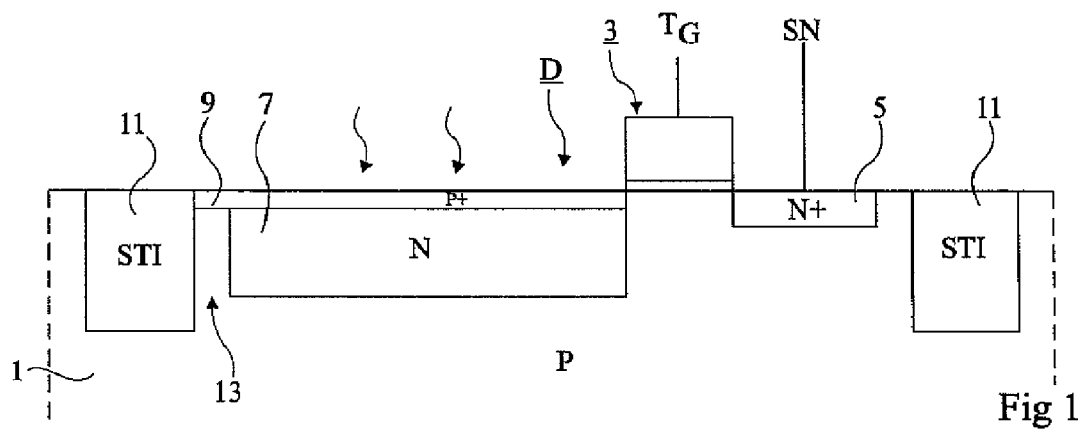
FIG. 1 is a simplified cross-section view of a photodiode associated with a charge transfer system of a conventional image sensor.

For clarity, the same elements have been designated with the same reference numerals in the different drawings. Further, as usual in the representation of integrated circuits, the various drawings are not to scale.

FIG. 1 is a simplified cross-section view of a photodiode associated with a charge transfer system of a conventional image sensor.

An insulated gate structure 3 is formed on a lightly-doped P-type semiconductor substrate 1. N-type drain and source regions 5 and 7 are located on either side of gate 3, at the surface of substrate 1. Drain region 5, to the right of gate 3, is heavily N-type doped ($N^+$). Source region 7 is formed on a larger surface area than drain region 5. Source region 7 forms, with substrate 1, the junction of a photodiode D. Gate 3 and drain 5 are linked to metallizations (not shown) which enable putting these regions respectively in contact with a transfer control signal ($T_G$) and with a read and processing circuit (read node SN). Photodiode D comprises, at the surface of source region 7, a shallow heavily-doped P-type region 9 ($P^+$). Photodiode D is called a depleted or pinned photodiode since the voltage of region 7 is, in the absence of lighting and after charge transfer, only set by the dopant concentrations of regions 1, 7, and 9.

The structure is completed with an insulating trench 11 formed around the photodiode and the insulated gate, which enables partly avoiding that electrons intended for a photodiode are captured by a neighboring photodiode. As an example, trench 11 may be an STI (Shallow Trench Isolation) trench, filled with oxide. Usually, trench 11 has a depth ranging between 0.3 and 0.7 µm. Thereby, this trench limits the crosstalk without however completely canceling it since electron/hole pairs may be photogenerated down to a depth from 3 to 10 µm in the substrate (according to the wavelength of the incident beam). Electrons can thus pass under trench 11 from the N area of a photodiode to the N area of a neighboring photodiode.

When the circuit is lit, photons penetrate into the substrate and form electron/hole pairs therein. The electrons are then attracted into accumulation region 7. When electrons stored in region 7 are desired to be transferred, an adapted voltage is applied on transfer gate 3 to form a channel in substrate 1. The electrons are thus taken to read node 5 of the transfer transistor, then to the read and processing circuit (not shown).

It should be noted that it is ascertained to keep a distance (interval 13) between N-type doped source region 7 and insulation trench 11. Indeed, when an insulating area is located close to a lightly-doped area, parasitic carriers create at the interface between the insulating material and the semiconductor material. Interval 13 enables limiting the creation of such carriers. However, this unused space at the substrate surface does not enable optimizing the size of the device.

As described previously, it is desired to decrease the pixel size. For this purpose, the size of photodiode D at the surface of substrate 1 could be decreased and the thickness of accumulation region 7 could be increased to keep a constant electron accumulation volume. However, interval 13 between electron accumulation region 7 and insulation trench 11 cannot be decreased, short of increasing the dark current. Further, it is generally ascertained to form N-type source and drain regions 7 and 5 of transfer transistor 3 in P-type doped substrate 1 to ensure the insulation between source and drain regions 7 and 5. However, this does not enable full transfer of the charges if accumulation region 7 is deep.

The increase in the thickness of region 7 could come along with a decrease in its doping but, in this case, the maximum charge storable in the photodiode would be decreased.

It could be devised to decrease the size of photodiode D while keeping an equal depth and to increase the doping of the N region, but it would then be necessary to apply a large transfer voltage on the transistor gate to enable the electron transfer.

An embodiment of the present invention provides a photodiode associated with a charge transfer system of an image sensor having reduced dimensions. Further, an embodiment of the present invention provides a photodiode associated with a charge transfer system of an image sensor with a low crosstalk, with a low dark current, and enabling efficient transfer of the electrons between the accumulation region of the photodiode and the read node of a transfer transistor.

Figure 2:
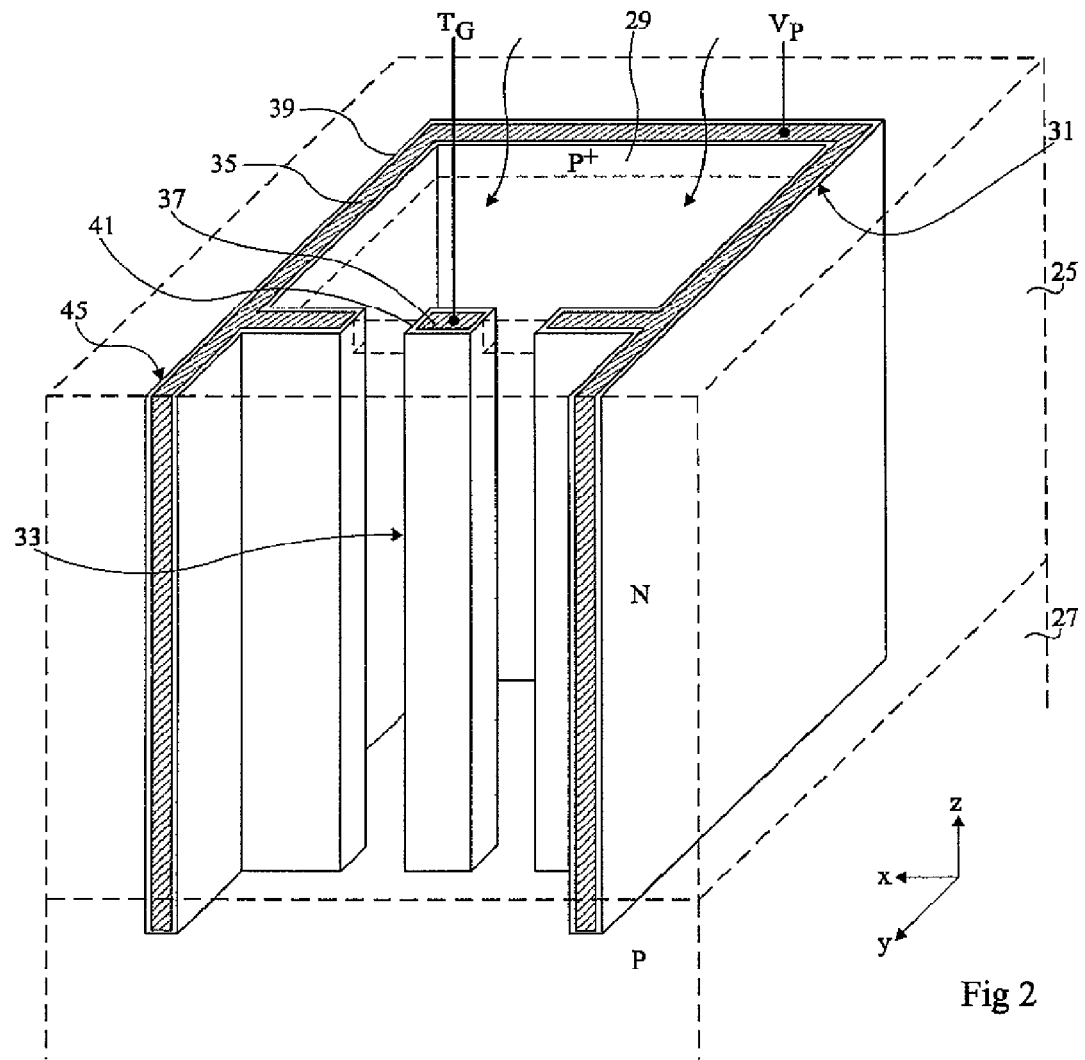
FIGS. 2 and 3 respectively are perspective and top views of a photodiode associated with a charge transfer system of an image sensor according to an embodiment.
Figure 3:
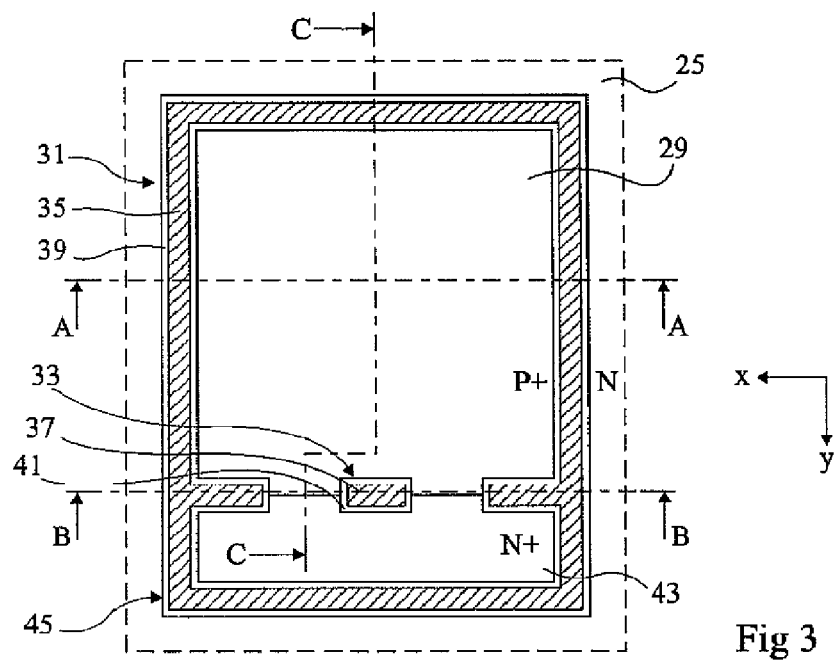

FIG. 2 is a perspective view of a photodiode associated with a charge transfer system of an image sensor according to an embodiment of the present invention. FIG. 3 illustrates this same device in top view, and FIGS. 4A and 4B in side views, respectively along cross-section lines A-A and B-B of FIG. 3.

The device of FIGS. 2, 3, 4A, and 4B is formed of a photodiode, of a transfer electrode, and of a read node coupled to the photodiode by the transfer electrode. The read node is connected to a read and processing circuit (not shown). For clarity, the read node region is not shown in FIG. 2. Similarly, part of the insulation of the device is only shown in the top view (FIG. 3).

The photodiode, the charge transfer electrode, and the read node are formed in an N-type semiconductor layer 25 which extends on a P-type semiconductor substrate 27.

As an example, layer 25 may have a thickness ranging between 1 and 10 μm and be formed by ion implantation and diffusion of N-type dopants into substrate 27. Layer 25 may also be formed by epitaxy on substrate 27. Layer 25 may be doped at a dopant concentration ranging between $5 \cdot 10^{15}$ at./cm$^3$ and $10^{17}$ at./cm$^3$ and substrate 27, or a layer above said substrate, may be doped at a dopant concentration ranging between $10^{14}$ at./cm$^3$ and $10^{19}$ at./cm$^3$. Conventionally, substrate 27 is biased to a reference voltage and it may be formed on any support.

The photodiode is delimited by an enclosure comprising a trench 31 and a column 33. Trench 31 practically surrounds the entire photosensitive area and is interrupted, all along its height, on a portion of the periphery of the photosensitive area. Column 33 is located, in alignment with trench 31, in the interruption area of this trench. Trench 31 and column 33 are filled with semiconductor material, respectively 35 and 37. A thin dielectric material layer 39 is formed between stack 25/27 and conductive material 35, on the walls of trench 31, and a thin dielectric material layer 41 is formed between stack 25/27 and conductive material 37, on the walls of column 33. As an example, conductive material 35, 37 may be heavily-doped polysilicon (for example, at a dopant concentration greater than $10^{19}$ at./cm$^3$) and thin dielectric layers 39 and 41 may be made of silicon oxide, silicon nitride, silicon oxynitride, or be formed of a multiple-layer silicon oxide-silicon nitride-silicon oxynitride stack, and have a thickness ranging between 5 and 15 nm, for example approximately 7 nm.

A heavily-doped P-type area 29 is formed at the surface of layer 25, within the enclosure formed by trench 31 and column 33. As an example, area 29 may be doped at a dopant concentration greater than $10^{18}$ at./cm$^3$ and be formed by an implantation/diffusion. Heavily-doped P-type area 29 enables avoiding for charges thermally generated at the surface of the device to reach the N layer of the photodiode.

As can be seen in the top view of FIG. 3, a heavily-doped N-type area 43 (N$^+$) is formed at the surface of layer 25, within the enclosure formed by trench 31 and column 33 and opposite to area 29 with respect to column 33. As an example, area 43 may have a thickness ranging between 0.1 and 0.3 μm and be formed by implantation/diffusion.

According to an embodiment and as can be better seen in FIG. 3, trench 31 may comprise an additional portion 45 surrounding heavily-doped N-type area 43. Portion 45 has a structure identical to that of trench 31, that is, it is filled with a conductive material insulated from layer 25. It enables ensuring the full insulation of the device. Thus, many structures such as that described herein can be formed at the surface of a substrate, next to one another, while limiting interferences between each of these structures. It should be noted that insulating portion 45 is partially illustrated in FIG. 2 for simplification.

The photodiode according to an embodiment of the present invention thus is a so-called "pinned" photodiode formed of area 29, of a portion of layer 25, and of substrate 27, having its boundary conditions set by insulation enclosure 31/33. The charge transfer transistor is formed of column 33, with conductive material 37 forming the transistor gate and dielectric material 41 forming the gate insulator, of heavily-doped N-type area 43 which forms its drain region or read node, and of the layer 25 located in the enclosure and delimited by trench 31 which forms its source region, the whole being formed in N-type layer 25.

In conventional photodiodes such as that of FIG. 1, N-type layer 7 is very thin and the photogenerated electron/hole pairs are mainly formed in P-type support 1, under layer 7. In the case of the photodiode of FIGS. 2 and 3, N-type layer 25 is relatively thick and the electron/hole pairs are mainly formed directly in this N-type layer.

The upper surface of the conductive material of trench 31/45 is connected to a metallization (not shown) which enables putting this material in contact with a bias signal ($V_P$). Similarly, the upper surface of the conductive material of column 33 is connected to a metallization (not shown) which enables putting this material in contact with a transfer control signal ($T_G$) and the upper surface of the conductive material of area 43 is connected to a metallization (not shown) which enables putting this material in contact with a read and processing circuit (read node SN).

As an example of numerical values, trench 31/45 and column 33 may have a depth ranging from 1 to 10 μm, preferably from 2 to 3 μm. As an example, trench 31/45 and column 33 may penetrate from 0 to 2 μm into substrate 27. The trench and the column may also not penetrate into substrate 27. In this latter case, it will be ascertained that the electrostatic potential wells of the photodiodes remain insulated, that is, for the distance between the bottom of the trench and the interface between layer 25 and substrate 27 is smaller than the transition area of PN junction 27/25, for example, smaller than 0.5 μm. Trench 31/45 and column 33 may have a width of approximately 0.2 μm and be separated, at the level of the interruption area of trench 31, by a distance approximately equal to 0.2 μm. Heavily-doped P-type area 29 may have dimensions approximately equal to 1×1 μm. Trench 31/45 and column 33 may be formed by any known deep trench insulation (DTI) forming technique.

Figure 4A:
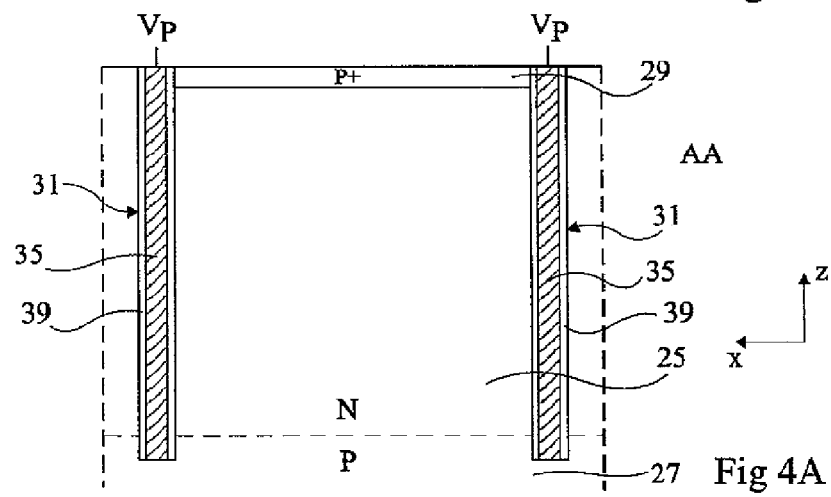
FIGS. 4A and 4B are cross-section views of the device of FIGS. 2 and 3 along cross-section lines, respectively, A-A and B-B of FIG. 3.
Figure 4B:
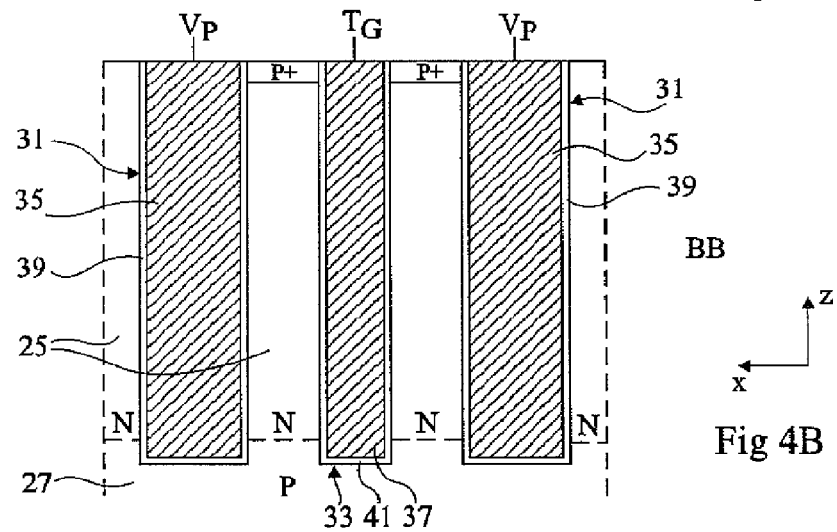

FIGS. 4C and 4D illustrate the operation of the photodiode associated with a charge transfer system of FIGS. 2, 3, 4A and 4B in charge accumulation mode. FIG. 4C is a cross-section view of this device along cross-section line C-C of FIG. 3, where insulation region 45 is not shown. FIG. 4D shows a curve 47 of the corresponding voltage $U_0$ along a line D-D defined in FIG. 4C.

In charge accumulation phase, bias signal $V_P$ and transfer control signal $T_G$ are set to a reference voltage. As an example, this voltage may be the ground voltage, or be a negative voltage (for example, equal to −1 V).

Such a biasing of conductive materials 35 and 37 provides an accumulation of holes ($t_+$) along the walls of trench 31/45 and of column 33. This sets area 29 to a reference voltage.

Thus, since substrate 27 is also biased to a reference voltage, the portion of layer 25 located within the enclosure (trench 31 and column 33) is surrounded with regions having their voltage set to a reference value. A potential well is thus formed in this portion of layer 25.

When the photodiode is illuminated, electron/hole pairs are photogenerated in layer 25. Since there exists an electrostatic potential well delimited by trench 31 and by column 33, the electrons tend to gather inside of region 25 of the photodiode, as shown in dotted lines in FIG. 4C ($e^-$).

Curve 47 of FIG. 4D illustrates electrostatic potential $U_0$ along a line D-D illustrated in FIG. 4C, at the center of the hole accumulation region (for example, 1 µm away from the surface of layer 25). In this curve, it can be seen that the electrostatic potential in region 25 of the photodiode reaches a maximum value $V_{max}$ at the center of the region 25 located within the enclosure. As an example of numerical values, with the previously-given dimensions and dopings, potential $V_{max}$ may be approximately 1 V.

FIGS. 5C and 5D illustrate the operation of the photodiode associated with its charge transfer system of FIGS. 2, 3, 4A and 4B in a phase of transfer of the charges accumulated in the photodiode. FIG. 5C is a cross-section view of this device along cross-section line C-C of FIG. 3 and FIG. 5D is a curve 49 of the corresponding potential $U_0$ along line D-D (for example, 1 µm away from the surface of the photodiode).

In transfer phase, bias signal $V_P$ is set to a reference voltage and transfer control signal $T_G$ is set to a voltage greater than maximum voltage $V_{max}$ in the photodiode in accumulation phase. Thus, conductive material 35 of trench 31/45 is set to a reference voltage, which maintains the accumulation of holes ($t_+$) along the wall of trench 31/45 and thus the insulation of the photodiode with respect to the neighboring photodiodes.

By biasing the conductive material of column 33 to voltage $V_1$, a channel creates in layer 25 around column 33. As an example, if $V_{max}$=1, $V_1$ may be between 2 and 3 V, for example, equal to 2.5 V. The channel enables transferring the electrons stored in layer 25 to read node 43, as shown in FIG. 5C by dotted lines.

Curve 49 of FIG. 5D illustrates electrostatic voltage $U_0$ along line D-D of FIGS. 4C and 5C. Since the electrons are attracted by the highest potential, this curve shows that the electrons are transferred to read node 43.

Thus, during the charge accumulation phase, column 33 enables insulation of the photodiode, in association with trench 31/45. During the transfer phase, column 33 becomes the gate of the transfer transistor and enables displacement of the electrons stored in the photodiode to a read and processing circuit.

As a comparison, a photodiode such as that described in relation with FIG. 1 having an N-type region 7 with a 0.2-µm thickness can accumulate approximately 5000 electrons per square micrometer of surface area. A photodiode according to an embodiment enables accumulating between 15,000 and 20,000 electrons per square micrometer space. Thus, photodiodes of very small dimensions having a significant electron accumulation capacity can be devised. It should be noted that the device according to an embodiment comprises no passive region such as region 13 of the device of FIG. 1; the electron accumulation occurs over the entire surface of the photodiode.

Further, the use of a trench 31/45 and of a column 33 (in accumulation phase) having significant depths, greater than 1 µm, enables significantly limiting the crosstalk.

The use of vertical column 33 as a gate of the transfer transistor advantageously enables transferring all the electrons formed in depth in region 25 of the photodiode. Thus, it is avoided that electrons remain in the photodiode after a read phase. Further, the biasing of trench 31 to a reference voltage, and also of column 33 during the accumulation phase, which forms an accumulation of holes at the photodiode periphery, enables eliminating dark currents which are usually formed at the interface with insulation areas. The structure according to an embodiment thus enables significantly decreasing parasitic physical phenomena which usually occur in conventional devices.

Figure 6:
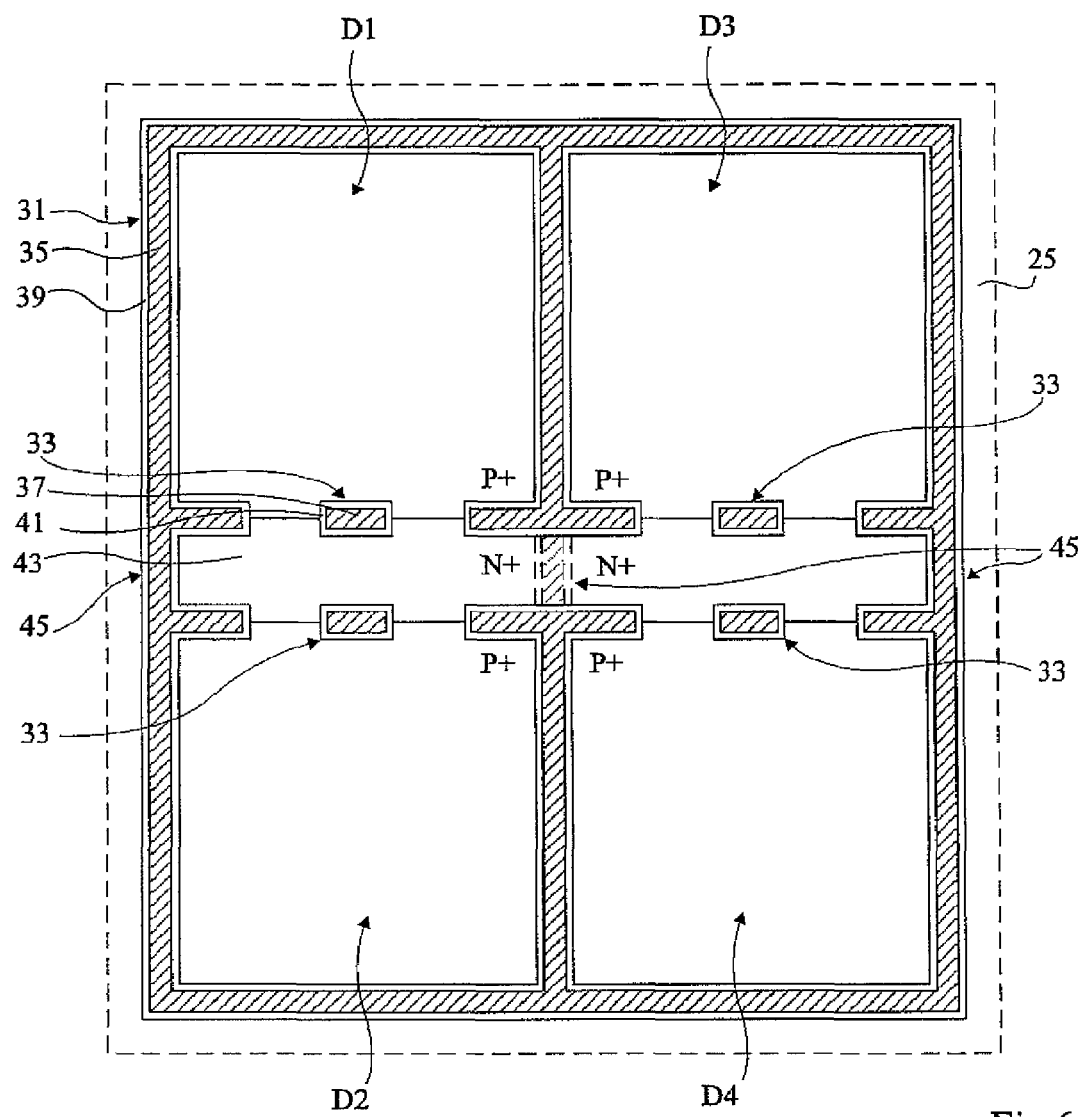
FIG. 6 illustrates, in top view, an alternative embodiment in which several photodiodes are associated with a same read node.

FIG. 6 illustrates, in top view, a currently preferred alternative embodiment in which a read node is common to several charge transfer systems, each transfer system being associated with a photodiode.

In FIG. 6, four photodiodes D1, D2, D3, and D4 are shown. Each photodiode has a structure identical to that of the photodiode of FIGS. 2 and 3, that is, it is formed in a semiconductor stack comprising an N-type layer formed on a P-type support (stack 25/27). Each photodiode also comprises a thin heavily-doped P-type layer 29 at the surface of layer 25.

Photodiode D1 is surrounded with a trench 31 identical to that shown in FIGS. 2 and 3, that is, a trench filled with a conductive material 35 separated from semiconductor stack 25/27 by a thin insulating layer 39 and biased to a reference voltage. Trench 31 is interrupted, all along its height, across a portion of its periphery. A column 33 identical to that described previously (filled with conductive material 37 and insulated from semiconductor material 25/27 by a thin insulating layer 41) is formed in this interruption. Conductive material 37 is connected to connection means enabling setting its potential to a reference voltage or to a voltage enabling transfer of the electrons. Opposite to photodiode D1 with respect to column 33 is a heavily-doped N-type read node 43 at the surface of layer 25.

Photodiode D2 has a structure identical to that of photodiode D1 and is placed symmetrically to photodiode D1 with respect to read node 43. Thus, read node 43 is common to photodiodes D1 and D2. A trench portion 45 connects trenches 31 of photodiodes D1 and D2. In operation, columns 31 of photodiodes D1 and D2 will alternately be biased to transfer the electrons stored in one or the other of these photodiodes.

Photodiodes D3 and D4 are arranged with respect to each other in the same way as photodiodes D1 and D2, and they are formed next to photodiodes D1 and D2. Their read node is also shared.

The common read nodes of photodiodes D1/D2 and D3/D4 may also be interconnected, either by forming a contact between these two regions or by eliminating the trench portion 45 separating photodiodes D1/D2 and D3/D4 at the level of areas 43.

Thus, two or four photodiodes can be gathered around a same read node. The electrons accumulated in each photodiode will be alternately transferred to the read node, by biasing the associated gates in adapted fashion. It may also be provided to form a single read and processing circuit for several photodiodes. Very small pixels are thus obtained.

Another advantage of a device according to an embodiment (device of FIGS. 2 and 3 or of FIG. 6) is its manufacturing simplicity. Indeed, since trench(es) 31/45 and column(s) 33 have similar dimensions and are filled with identical materials, these regions can be formed simultaneously.

Thus, to obtain a device according to an embodiment, the following steps may be carried out:
 forming trench(es) 31/45 and column(s) 33 in P-type doped substrate 27 in a single step;
 forming, in trench(es) 31/45 in and column(s) 33, thin insulating layers 39 and 41, followed by polysilicon 35 and 37;

forming lightly-doped N-type layer 25 on P-type doped substrate 27, for example, by implantation and diffusion of dopants;

forming heavily-doped areas 29 and 43 at the surface of layer 25, for example, by implantations/diffusions; and forming metallizations on polysilicon portions 35 and 37 and on read node(s) 43.

Layer 25 may also be formed by epitaxy on substrate 27, before forming trenches 31/45 and columns 33.

It should be noted that, in the present disclosure, all the numerical dimension and doping values are given as non-limiting examples only. It should also be noted that conductivity types N and P may be inverted, layer 25 and read node 43 then being of type P and substrate 27 then being of type N.

Specific embodiments of the present invention have been described. Different variations and modifications will occur to those skilled in the art. In particular, it may be provided to form two or more columns such as column 33 in the interruption area of trench 31. These columns will be interconnected to form the transfer transistor gate during the reading and to aid the insulation during the accumulation phase. Such a structure has the advantage of enabling transfer of the electrons contained in the photodiode to the read node by application of a low transfer voltage.

Further, image capture devices in which the photodiode is a pinned photodiode have been described herein. It should be understood that any known type of photodiode may be formed in the enclosure delimited by trench 31 and column 33. For example, a photodiode without heavily-doped P-type area 29 may be considered.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An image sensor formed in a semiconductor stack of a lower region of a first conductivity type and of an upper region of a second conductivity type, comprising:
    a photodiode formed of a first portion of said stack;
    a read area formed of a second portion of said stack;
    a trench with insulated walls filled with a conductive material, the trench surrounding the photodiode and the read area and being interrupted, all along its height, on a portion situated between the photodiode and the read area; first connection means associated with the conductive material of the trench and capable of being connected to a reference bias voltage;
    a column with insulated walls, filled with a conductive material formed in the interruption area of the trench; and
    second connection means associated with the conductive material of the column and capable of being connected to a reference bias voltage or to a transfer voltage.

2. The image sensor of claim 1, wherein a heavily-doped area of the second conductivity type is formed at a surface of the read area, said area forming the drain of a transistor, with its column forming the gate thereof.

3. The image sensor of claim 1, wherein a heavily-doped area of the first conductivity type is formed at a surface of the photodiode.

4. The image sensor of claim 1, wherein the trench and the column have depths ranging between 1 and 10 µm and wherein the conductive material in the trench and in the column is polysilicon, and the material forming the insulated walls of the column and of the trench is selected from the group comprising silicon oxide, silicon nitride, silicon oxynitride, or is formed of a multiple-layer stack of these materials.

5. The image sensor of claim 1, wherein the first conductivity type is type P and the second conductivity type is type N.

6. The image sensor of claim 1, comprising at least one second column with insulated walls filled with a conductive material in the interruption area of the trench, the conductive material of the second column being connected to the conductive material of the first column.

7. The image sensor of claim 1, comprising at least two photodiodes in front of a same read area.

8. A method for manufacturing an image sensor comprising the steps of:
    (a) forming, in a semiconductor substrate of a first conductivity type, a trench and a column, the trench surrounding at least a portion of the substrate and being interrupted, across a portion of its periphery and all along its height, the column being located in the trench interruption region;
    (b) forming, on the bottom and the walls of the trench and of the column, an insulating layer;
    (c) filling the space remaining in the trench and in the column with a conductive material;
    (d) forming, in the semiconductor substrate of the first conductivity type and on the entire surface thereof, a layer of a second conductivity type;
    (e) forming, in the enclosure delimited by the trench and the column, at the surface of the layer of the second conductivity type, a heavily-doped area of the first conductivity type; and
    (f) forming, opposite to the heavily-doped area of the first conductivity type with respect to the column, at the surface of the layer of the second conductivity type, a heavily-doped area of the second conductivity type.

9. The method of claim 8, in which step (d) is performed before step (a).

10. A method for using the image sensor of claim 1, comprising the steps of:
    connecting the first connection means associated with the conductive material of the trench to a reference bias voltage;
    connecting the second connection means associated with the conductive material of the column to a reference bias voltage;
    exposing the image sensor to a light source which is desired to be detected; and
    connecting the second connection means associated with the conductive material of the column to a voltage greater than the maximum electrostatic potential of the electrons captured by the photodiode, and connecting the heavily-doped area of the second conductivity type to an adapted read and processing circuit.

* * * * *